United States Patent
Wang et al.

(10) Patent No.: US 9,536,697 B2
(45) Date of Patent: Jan. 3, 2017

(54) SYSTEM AND METHOD FOR CALIBRATING CHARGE-REGULATING MODULE

(71) Applicant: Hermes Microvision Inc., Hsinchu (TW)

(72) Inventors: Yi-Xiang Wang, Fremont, CA (US); Jian Zhang, San Jose, CA (US); Yan Zhao, San Jose, CA (US)

(73) Assignee: HERMES MICROVISION INC., Hsinchu (TW)

( * ) Notice: Subject to any disclaimer, the term of this patent is extended or adjusted under 35 U.S.C. 154(b) by 0 days.

(21) Appl. No.: 14/716,385

(22) Filed: May 19, 2015

(65) Prior Publication Data

US 2016/0343534 A1    Nov. 24, 2016

(51) Int. Cl.
*G01N 23/00*    (2006.01)
*H01J 37/02*    (2006.01)
*H01J 37/244*    (2006.01)
*H01J 37/26*    (2006.01)

(52) U.S. Cl.
CPC ............ *H01J 37/026* (2013.01); *H01J 37/244* (2013.01); *H01J 37/265* (2013.01)

(58) Field of Classification Search
CPC .......... H01J 37/00; H01J 37/02; H01J 37/026; H01J 37/20

USPC ..................... 250/306, 307, 310, 311, 492.1, 492.2, 250/492.3
See application file for complete search history.

(56) References Cited

U.S. PATENT DOCUMENTS

| | | | |
|---|---|---|---|
| 6,392,231 B1 | 5/2002 | Chen | |
| 6,465,781 B1 * | 10/2002 | Nishimura | H01J 37/026 250/305 |
| 7,211,796 B2 * | 5/2007 | Nagahama | H01J 37/28 250/310 |
| 7,863,565 B2 * | 1/2011 | Hasegawa | G01N 23/225 250/306 |
| 2003/0213893 A1 * | 11/2003 | Nagahama | H01J 37/28 250/210 |
| 2005/0051722 A1 * | 3/2005 | Makino | G01N 23/04 250/306 |
| 2014/0070113 A1 * | 3/2014 | Straw | H01J 37/226 250/453.11 |

* cited by examiner

*Primary Examiner* — Jason McCormack
(74) *Attorney, Agent, or Firm* — WPAT, PC; Justin King; Jonathan Chiang

(57) ABSTRACT

This invention provides a system and a method for calibrating charge-regulation module in vacuum environment. Means for mounting the charge-regulation module provides motions to the charge-regulation module such that a beam spot, illuminated by the charge-regulation module, on a sample surface can be moved to a pre-determined position which is irradiated by a charged particle beam.

21 Claims, 10 Drawing Sheets

SYSTEM AND METHOD FOR CALIBRATING CHARGE-REGULATING MODULE

BACKGROUND OF THE INVENTION

1. Field of the Invention

The present invention relates to a system and method for calibrating charge-regulating module, and more particularly to a charged particle beam system with a calibratable charge-regulating module.

2. Description of the Prior Art

Improvements in the semiconductor manufacturing technology have allowed for designing and manufacturing of higher density integrated circuits and packing more transistors on a given surface area to form a semiconductor device or chip. Increasing transistor density on a given chip has led to the need for method to provide electrically related, higher resolution wafer inspection. In semiconductor device manufacturing processes, defects may be unintentionally generated during the various stages of semiconductor processing. Thus, it is important to find defects accurately and efficiently as early as possible. Generally, a process for manufacturing semiconductor devices comprises the operation of forming layers of a variety of materials on or in the substrate of each semiconductor device; photo-processing, masking and forming circuit patterns on the semiconductor device; and removing or etching portions of the layers to form the semiconductor device. Such semiconductor devices are manufactured by repeating these and other operations on each device of a semiconductor wafer. Better manufacturing techniques have allowed for micro fabrication, resulting in features that are much less visible by most observation tools. Inspections of the wafer are made to check for obtaining defect free devices. In view of this requirement, charged particle beam systems, e.g. scanning electron microscopes (SEMs), electron beam probers and focused ion beam (FIB) systems, are used in such purpose.

Charges on a wafer sample may be accumulated when scanned by the current charged particle beam tools, particularly for the ebeam inspection tool due to larger beam current requirement, and quality of the acquired image will thus be deteriorated due to the accumulated charges on the surface of the wafer sample. Critical defects then can be hardly identified. In order to get rid of this issue, a charge regulation method is provided to regulate or control charge conditions wafer surface. One charge regulation module is to use Laser illuminating onto the wafer surface, and charged can be regulated due to photoconductivity and/or photoelectric effect.

However, after the charge regulation module is mounted to the charged particle beam tool, the illuminated area by Laser may be deviated from the point irradiated by the charged particle beam on the wafer surface due to installation or operation of the charged particle tool, and charge conditions thereon may be again deteriorated little by little. A calibration is thus necessary. Nevertheless, the charged particle tool is built within a vacuum chamber, and the calibration procedure of charge-regulation module means to breakdown the vacuum environment to atmosphere in the chamber. After the charge-regulation module is calibrated, the chamber has to be processed to vacuum environment. Such a calibration procedure is a time-consuming schedule, about 2-days or longer.

Therefore, it is desirable to provide a method a system for calibrating the charge regulation module in the charged particle beam tool.

SUMMARY OF THE INVENTION

The present invention provides a system and a method for calibrating charge-regulation module in vacuum environment. The charge-regulation module provides a beam on a sample surface and charges on the sample surface can be regulated. A beam spot is thus formed on the sample surface. Means for mounting charge-regulation module can provide motions to the charge-regulation module such that the beam spot on the sample surface can be moved to a pre-determined position which is irradiated by a charged particle beam. In a case of ebeam inspection, charge environment of a sample wafer or mask, a primary electron beam irradiates the pre-determined position, and charges of the pre-determined position can be regulated.

One embodiment of the present invention provides a system for calibrating a charge-regulating module, which comprises means for mounting a Laser and providing motions to move the Laser, a detector, a controller coupled to the detector, and a transmission coupled to the controller. The Laser illuminates a beam on a surface of a sample with a beam spot thereon, and regulates charges on the sample surface. The detector receives a reflected beam from the beam spot on the sample surface. The controller receives signals from the detector, calculates a position of the beam spot, and controls the beam spot to a pre-determined location. The transmission drives the mounting means such that the beam spot can be moved to the pre-determined position.

The mounting means is fastened to an objective lens of a charged particle beam tool, and the pre-determined location is irradiated by a charged particle beam of the charged particle beam tool. The charged particle beam tool could be an ebeam inspection tool and the sample could be a wafer or a mask.

The mounting means, in one embodiment, may include a first motor for driving the Laser with a rotational motion, and a second motor for driving the Laser with a vertical motion. The transmission is a hollow rod within wires for providing powers and instructions to the first and second motors.

The mounting means, in another embodiment, may be a C-shape mount and the Laser is fastened thereto. The transmission includes a rotation-to-translation means and a carved body not only fastened to the rotation-to-translation means but also engaged to the C-shape mount. A portion of the C-shape mount, engaged with the carved body, is forced to distort in vertical motion and to expand with horizontal motion.

Another embodiment of the present invention provides an ebeam inspection tool, which comprises an electron tip for providing an electron source, an anode for extracting the electron source as a primary electron beam, a condenser lens for condensing the primary electron beam, a magnetic objective lens for focusing the primary electron beam on a surface of a sample, a charge-regulation module for regulating charges in the sample surface, and a system for calibrating the charge-regulation module. The charge-regulation module is fastened to the magnetic objective lens. The system for calibrating the charge-regulation module includes means for mounting the charge-regulation module and providing motions to move the charge-regulation module, a detector, a controller coupled to the detector, and a transmission coupled to the controller. The charge-regulation module illuminates a beam on a surface of a sample with a beam spot thereon. The detector receives a reflected beam from the beam spot on the sample surface. The controller receives signals from the detector, calculates a position of the beam spot, and controls the beam spot to a pre-determined location. The transmission drives the mounting means such that the beam spot is moved to the pre-determined location. The sample, in the embodiment, is a wafer or a mask.

The mounting means, in one embodiment, may include a first motor for driving the charge-regulation module with a rotational motion, and a second motor for driving the charge-regulation module with a vertical motion. The transmission is a hollow rod within wires for providing powers and instructions to the first and second motors.

The mounting means, in another embodiment, may be a C-shape mount and the charge-regulation module is fastened thereto. The transmission includes a rotation-to-translation means, and a carved body not only fastened to the rotation-to-translation means but also engaged to the C-shape mount. A portion of the C-shape mount, engaged with the carved body, is forced to distort in vertical motion and the portion of the C-shape mount is forced to expand with horizontal motion.

The present invention also provides a method for calibrating a charge-regulation module under vacuum environment, which comprises steps of providing a beam on a surface of a sample by the charge-regulation module to form a beam spot on the surface, detecting a location of the beam spot, calculating a pre-determined position of a charged particle beam on the surface, and driving the charge-regulation module such that the beam spot moves to the pre-determined position.

DETAILED DESCRIPTION OF EXAMPLE EMBODIMENTS

Figure 1:
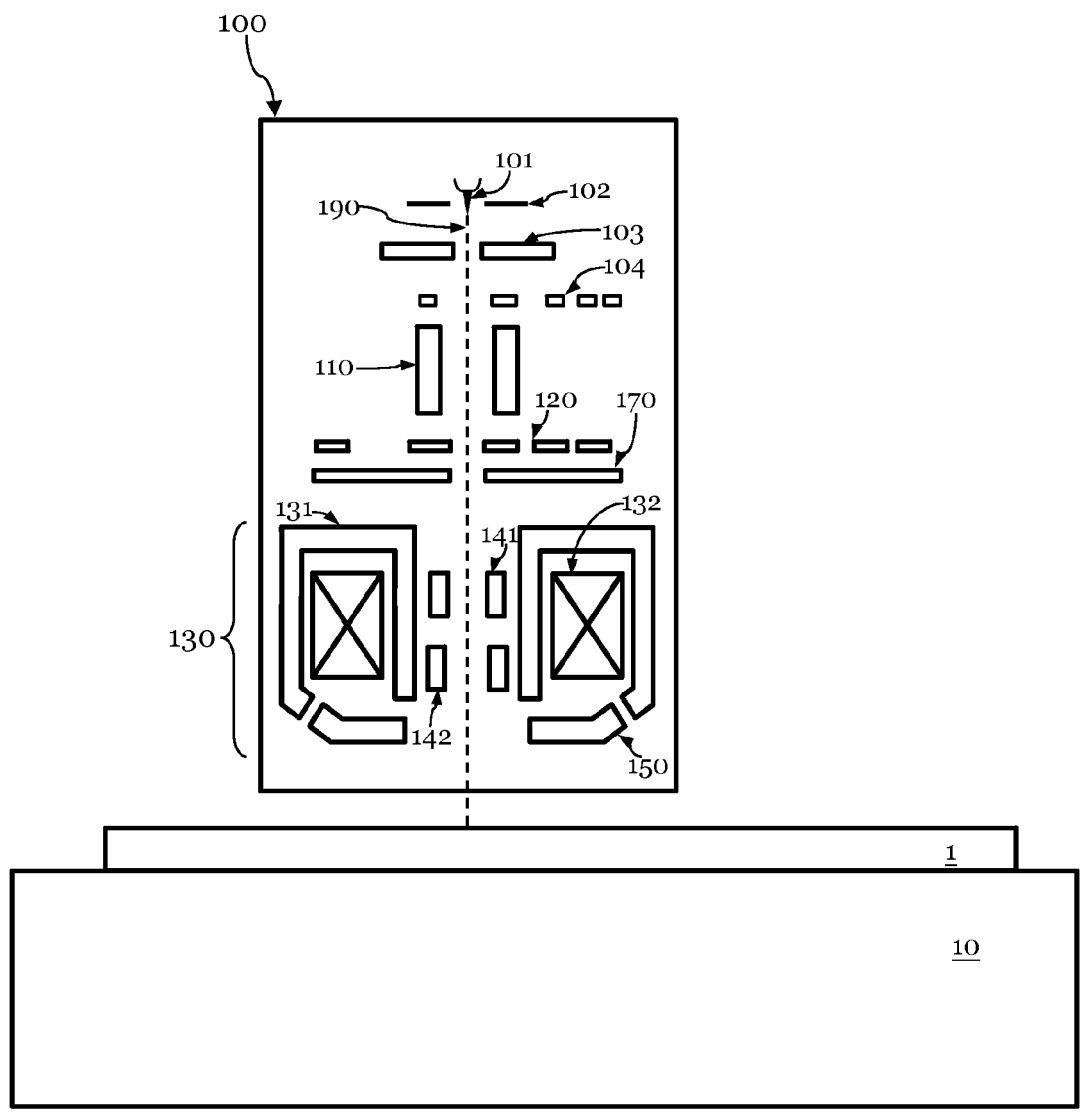
FIG. 1 is a schematic diagram of a charged particle beam system according to one embodiment of the invention.

Various example embodiments of the present invention will now be described more fully with reference to the accompanying drawings in which some example embodiments of the invention are shown. In the drawings, the thicknesses of regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

Reference will now be made in detail to specific embodiments of the invention. Examples of these embodiments are illustrated in accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a through understanding of the present invention. The present invention may be practiced without some or all of these specific details. In other instances, well known process operations and elements are not described in detail in order not to unnecessarily obscure the present invention.

The term "calibtrable" in the present invention means the charge regulation module is capable of being calibrated.

The term "ebeam" in the present invention means electron beam.

In the present invention, charged particle beam tools may be SEM (Scanning Electron Microscope), TEM (Tunneling Electron Microscope), STEM (Scanning Tunneling Electron Microscope), AFM (Atomic force Microscope), or FIB (Focused Ion Beam). For defect inspection applied to silicon wafer, commercial ebeam inspection tools always base on SEM scheme. Hence, SEM-based ebeam inspection tools are used as a preferred embodiment in this invention.

A SEM-based ebeam inspection tool can be referred to FIG. 1. The SEM 100 includes an electron gun and a column, wherein the electron gun includes a tip 101, a Schottky suppressor electrode 102, an anode 103, a selectable Coulomb aperture plate 104, and a condenser lens 110. The tip 101, emitting a primary electron beam 190, can be a high temperature Schottky point cathode which is ZrO/W Schottky electrode. The Schottky suppressor electrode 102 provides a virtual source of the primary electron beam 190. The anode electrode 103 provides an electric field to extract electrons from the tip 101. Then, the primary electron beam 190 is then passed through the selectable Coulomb aperture plate 104 such that aberration caused from the Coulomb force can be reduced. And, the primary electron beam is then condensed by the condenser lens 110. The condenser lens 110, in the FIG. 1, is an electrostatic lens, but, for any person skilled in the art, one or more than one magnetic lens can also be applied to the SEM 100.

The column in the SEM 100 includes a beam current plate 120, a detector 170, two deflectors 141 and 142, and an objective lens 130. The beam current plate 120, includes a plurality of apertures, is for users to select suitable beam current of the primary electron beam. The primary electron beam is then focused by the objective lens 130 on the wafer sample 1 supported by a stage 10. The sample 1 in the present invention can be a mask for lithographic process, a silicon wafer, a GaAs wafer, a SiC wafer, or any other substrate for semiconductor process. The objective lens 130, in FIG. 1, is a magnetic lens which includes a coil 132 encompassed by a yoke 131. Two deflectors 141 and 142 deflect to scan the primary electron beam 190 on the wafer sample 1. An electrode 150 below the objective lens 130 can provide a retarding or immersion electric field for the primary electron beam 190. A potential can be applied to the stage 10 such that landing energy of the primary electron beam 190 can be adjusted or controlled. The objective lens 130 illustrated in FIG. 1 is a basic, common one in commercial SEM, but variant designs and structures for specific purposes can be also applied to the present invention, such as SORIL lens, for large FOV (Field Of View) inspection, provided by Chen et al in the U.S. Pat. No. 6,392,231.

Figure 2:
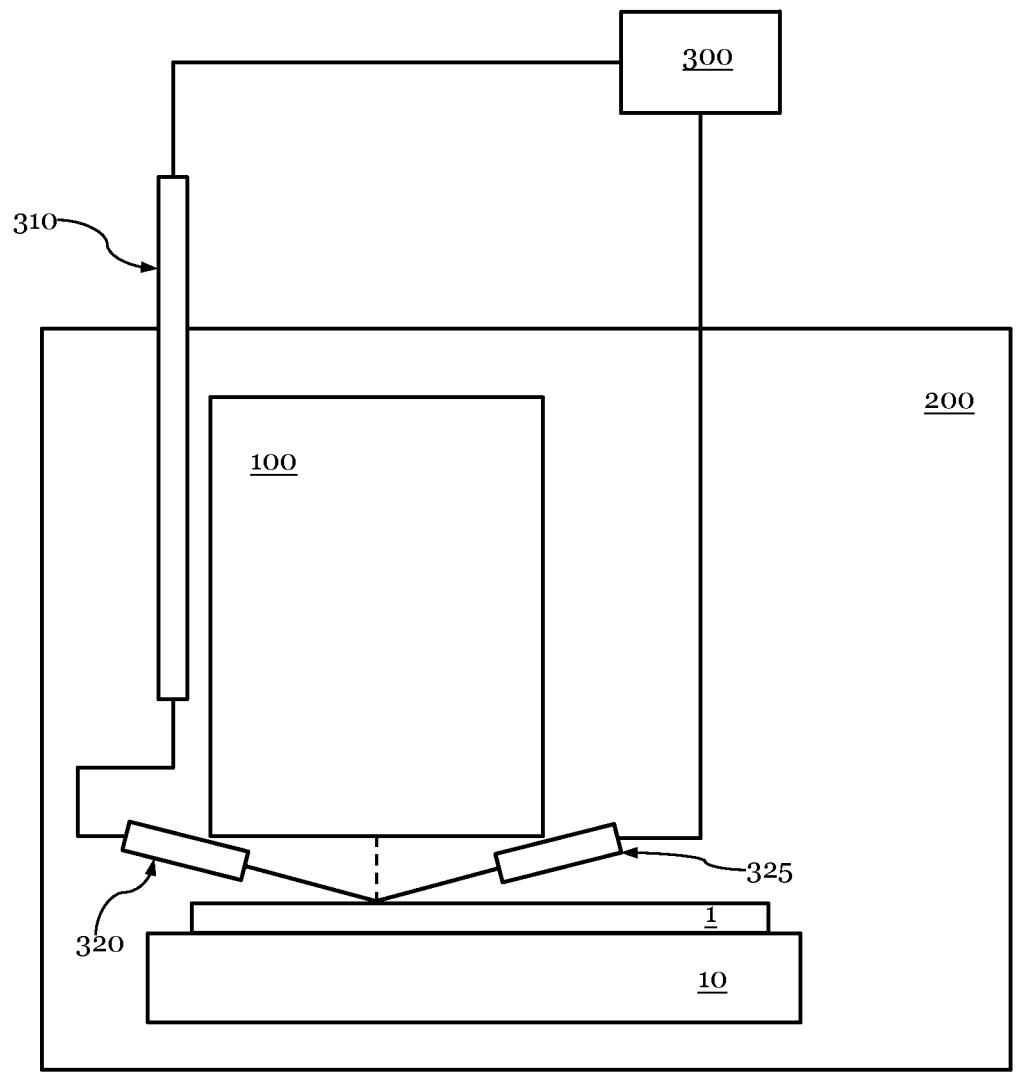
FIG. 2 illustrates an embodiment of a calibratable charge regulation module according to the present invention.

The charge regulation module in the present invention can be referred to FIG. 2, wherein a Laser 320 illuminates a specific electromagnetic wave on a surface of the wafer sample 1 and a beam spot is formed on a surface of the sample 1. The electromagnetic wave is then reflected to a detector 325 which may be CCD (Charge-Coupled Device) or CMOS(Complementary Metal-Oxide-Semiconductor) sensor. After the detector 325 receiving signals from the Laser 320, a controller 300 detects a location of the beam spot on the surface of the sample 1, calculates a pre-determined position which is irradiated by the primary electron beam 190, and drives the Laser 320 to illuminate the beam spot to the pre-determined position via the transmission 310. The SEM 100, the Laser 210, the detector 325, the wafer sample 1, and the stage 10 are all inside the vacuum chamber 200. The controller 300, may be a computer or ASIC (Application Specific Integrated Circuit), is always outside the vacuum chamber 200. The transmission 310 is the only one through the vacuum chamber 200.

Figure 3A:
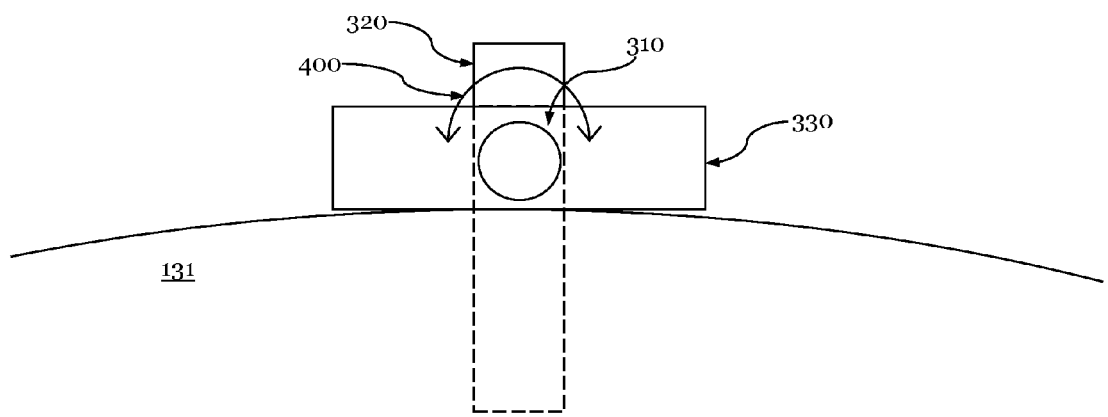
FIG. 3A is a top view for illustrating an operation for calibrating the charge regulation module according to one embodiment of the invention.
Figure 3B:
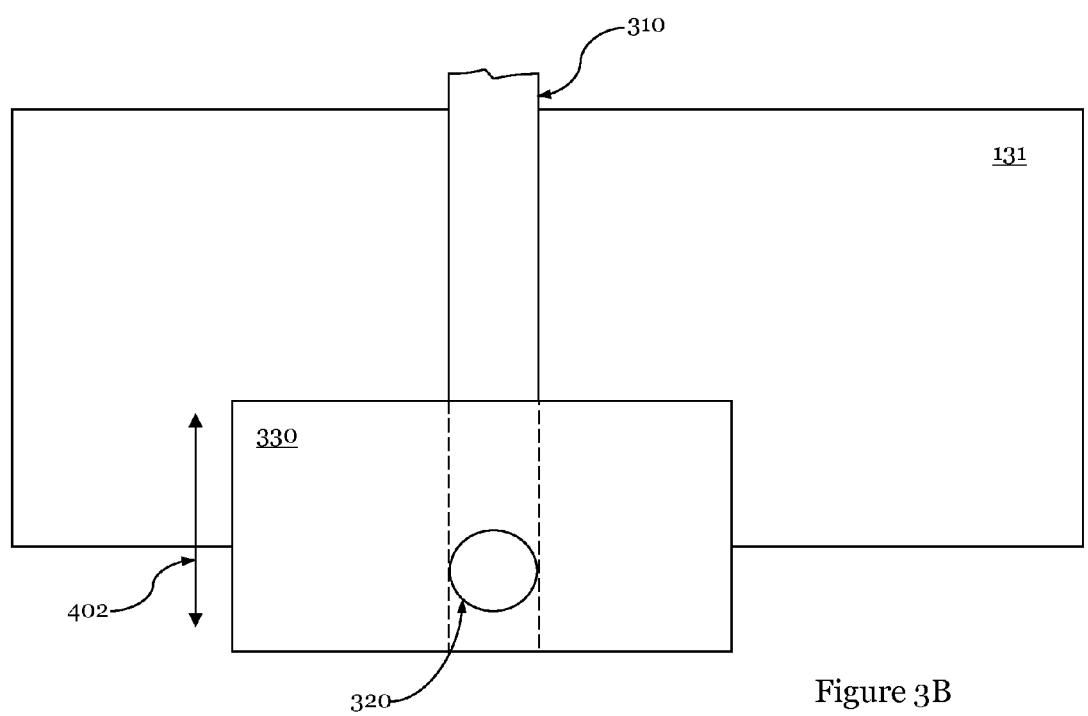
FIG. 3B is a side view for illustrating an operation for calibrating the charge regulation module according to one embodiment of the invention.
Figure 3C:
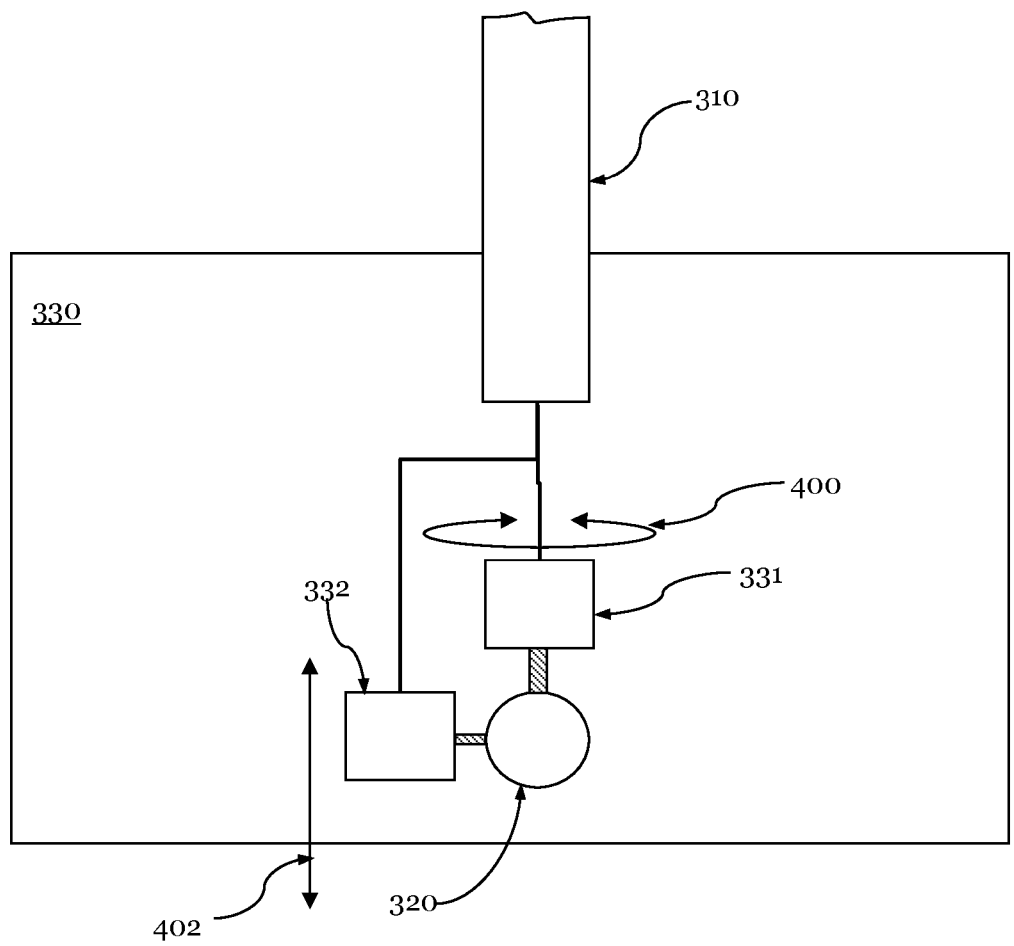
FIG. 3C is schematic diagram of an operation for calibrating the charge regulation module according to one embodiment of the invention.

A first embodiment of the present invention can be referred to FIG. 3A, FIG. 3B, and FIG. 3C. A mount 330, fastened to the yoke 131, is for holding the Laser 320, and the transmission 310 can directly control the Laser 320 in a rotational motion 400 by a motor 331. The mount 330 can be driven by another motor 332 with a vertical motion 402. Therefore, the Laser 320 can be adjusted by using the two motions 400 and 402 such that spot of the Laser 320 on wafer sample can be controlled at desired locations. The transmission 310 in this embodiment may be designed as a hollow rod within electric wires inside to provide instructions and powers to the both motors.

Figure 4A:
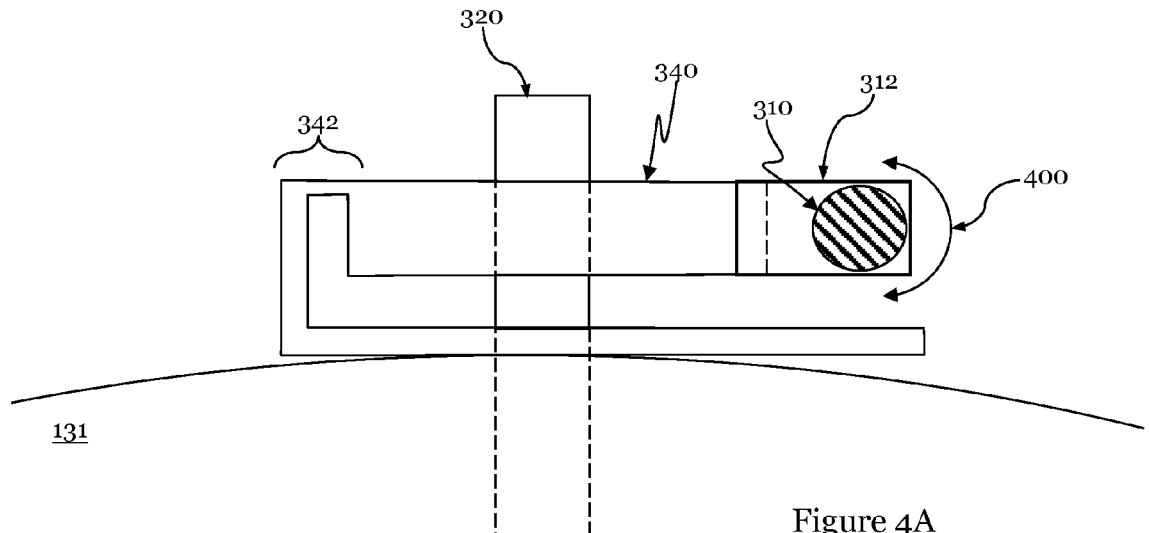
FIG. 4A is a top view for illustrating an operation for calibrating the charge regulation module according to another embodiment of the invention.
Figure 4B:
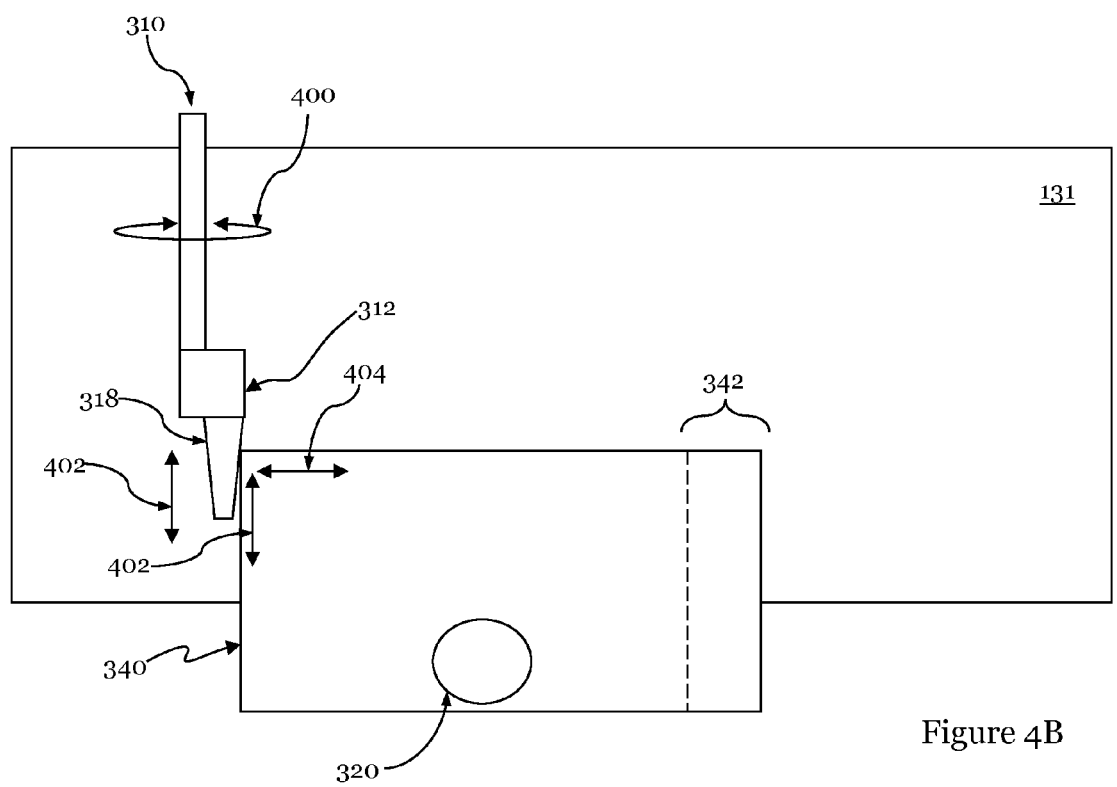
FIG. 4B is a side view for illustrating an operation for calibrating the charge regulation module according to another embodiment of the invention.
Figure 5:
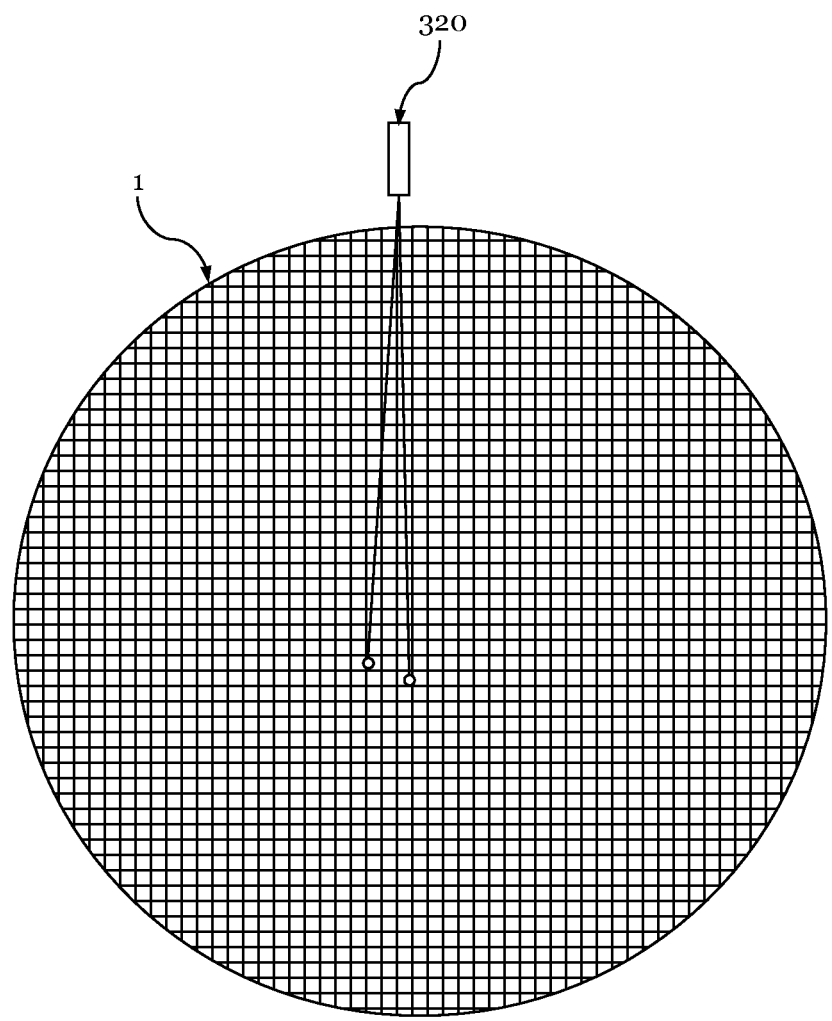
FIG. 5 is a schematic diagram of Laser beam spot on surface of wafer sample in an embodiment of the present invention.

Another embodiment of the present invention, which can be referred to FIG. 4A and FIG. 4B, that one motion transmission could provide the charge regulation module calibrated in desired locations on the wafer sample. A C-shape mount 340, fastened to the yoke 131, with a clamp 342 such that the mount 340 could have a little flexibility, which could be expanded or suppressed at the open ends. Laser 320 is mounted to the C-shape mount 340 without any degree of freedom to move. The transmission 310, which is a solid rod in this embodiment, can provide a rotation motion 400 and fastened with a rotation-to-translation means 312. The rotation-to-translation means 312 is attached with a carved body 318 such that the carved body 318 has a vertical motion 402. The carved body 318 has a declined surface which is engaged with the C-shape mount 340. When the carved body 318 is moved vertically 402, the C-shape mount 340 is forced to distort in two directions. The first is that the contact surface of the mount 340 with the carved body 318 will be forced in vertical motion 402, and the second is that the contact portion between the mount 340 and the carved body 318 will be forced in horizontal motion 404. However, because the C-shape mount 340 has a clamp 342, the open ends of the mount 340 will be enlarged a little. Then, a spot, illuminated by the Laser 320 fastened to the mount 340, on the wafer sample 1 won't move in a straight line, but a mixture of motions is provided. In FIG. 5, spot illuminated by the Laser 320 on surface of the wafer sample 1 is illustrated. Due to there are two motions applied to the Laser 320 simultaneously, the spot will move in two directions on the surface of the wafer sample 1.

Figures 6A, 6B:
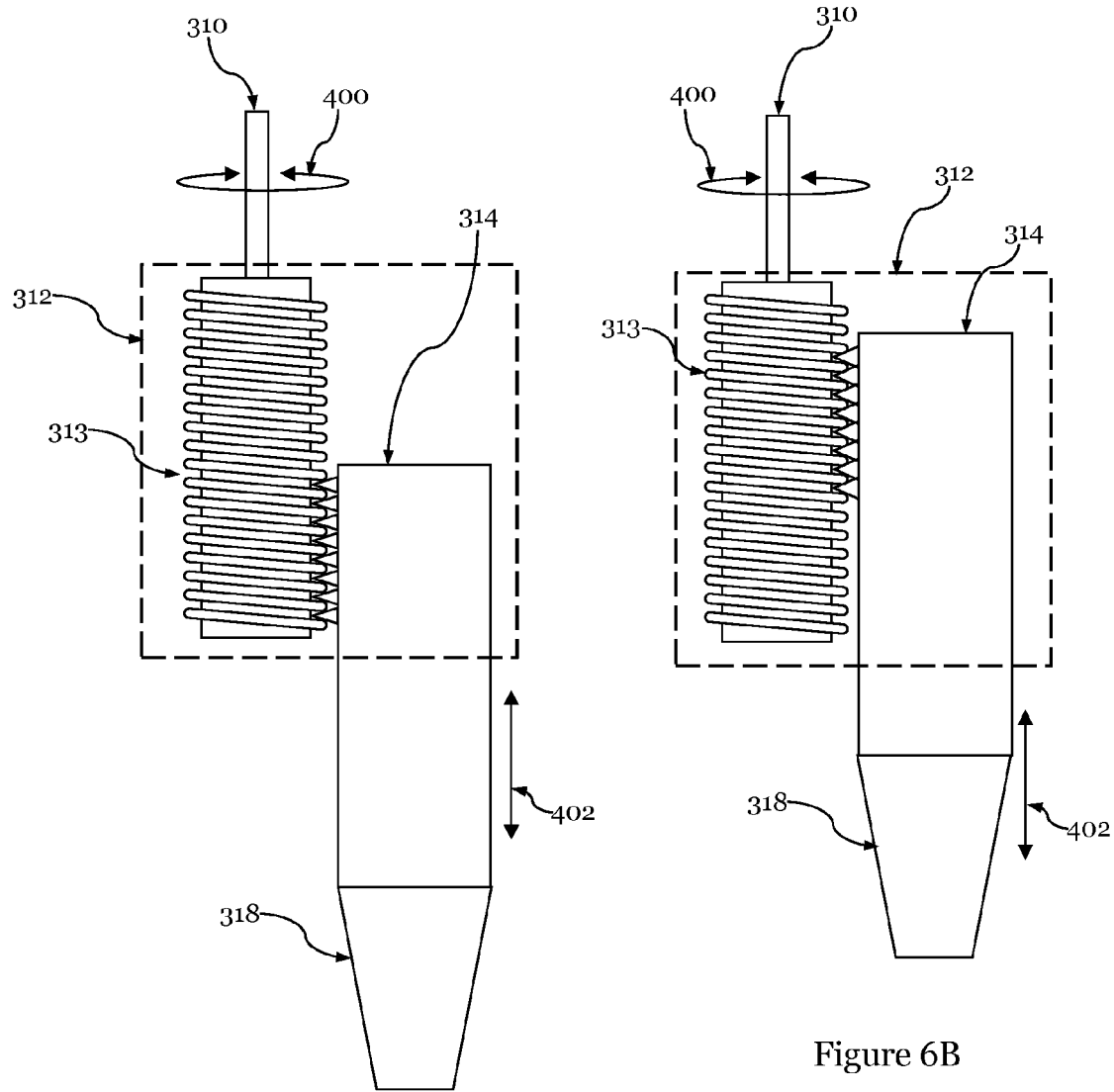
FIGS. 6A and 6B illustrate a rotation-to-translation means in an embodiment of the present invention.

One detail embodiment of the rotation-to-translation means 312 can be referred to FIG. 6A and FIG. 6B, wherein one end of the transmission 310 is a screw body 313 and engaged with gears 314. When the transmission 310 rotates 400, the carved body 318 will moved vertically 402 due to operations of the gears 314 and screw 313. Any means, combined by screws/gears or other parts, for transferring the rotation to translation motions could be applied to this invention.

Figure 7:
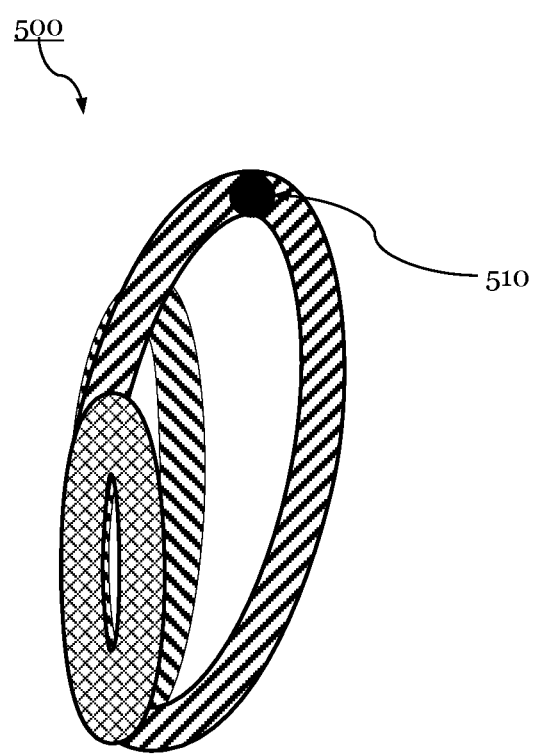
FIG. 7 illustrates several paths of Laser beam spot on the surface of the wafer sample when the charge regulation module is calibrated in one embodiment of the present invention.

Detail path 500 of the spot on the surface can be referred to FIG. 7, where three paths are illustrated for example with one spot 510 illuminated by the Laser 320. When the transmission 310 rotates in one direction, the spot on surface of the wafer sample will also move along a curve line. It is because the two motions combined together and ratio between expansion of C-shape mount due to horizontal motion 404 and downward of C-shape mount 340 due to vertical motion 402 is not linear. However, when the transmission 310 is rotated back, the beam spot won't trace back. It is because that when external forces applied to the mount 340 is released, the two directions of distorted mount 340 won't be returned back to the original shape simultaneously. If the distorted directions could be returned back simultaneously, the beam spot will move along the original curve on the surface of the wafer sample. Different materials of the mount 340 may contribute variant curves to the beam spot paths. Thus, please refer to the beam spot 510 in FIG. 7, when the transmission 310 is rotated back, the beam spot 510 will move back along a new path to the original and a closed loop is formed. There are three paths in FIG. 7 to illustrate the beam spot will overlap along a curve when it moved from the original location, and the beam spot will divert to three different paths when different rotation back point of the transmission 310 is triggered. Therefore, in the present invention, all possible paths should be recorded for user to adjust the Laser 320.

Figure 8:
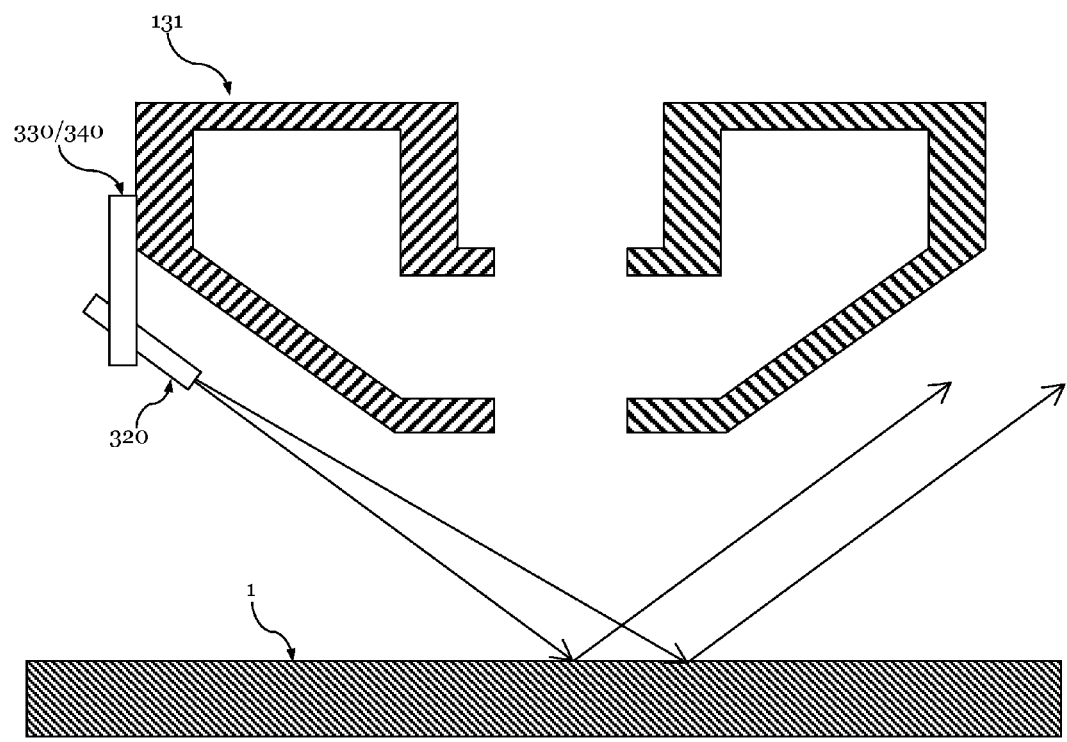
FIG. 8 illustrates a cross-sectional, side view of the charge regulation module mounted to the yoke and operated to the wafer sample.

In FIG. 8, a side, sectional view is illustrated, wherein the Laser 320 is fastened to the mount 330/340 and illuminates a beam spot on the wafer sample 1. The working distance between yoke 131 and wafer sample 1 is always short compared to the scale of the yoke 131. Therefore, the angle between beam and the wafer sample 1 is very close to about 1-10 degree. Due to the ebeam spot size is much smaller than the Laser beam spot, locations of the Laser beam spot to be calibrated is limited to a small range.

Figure 9:
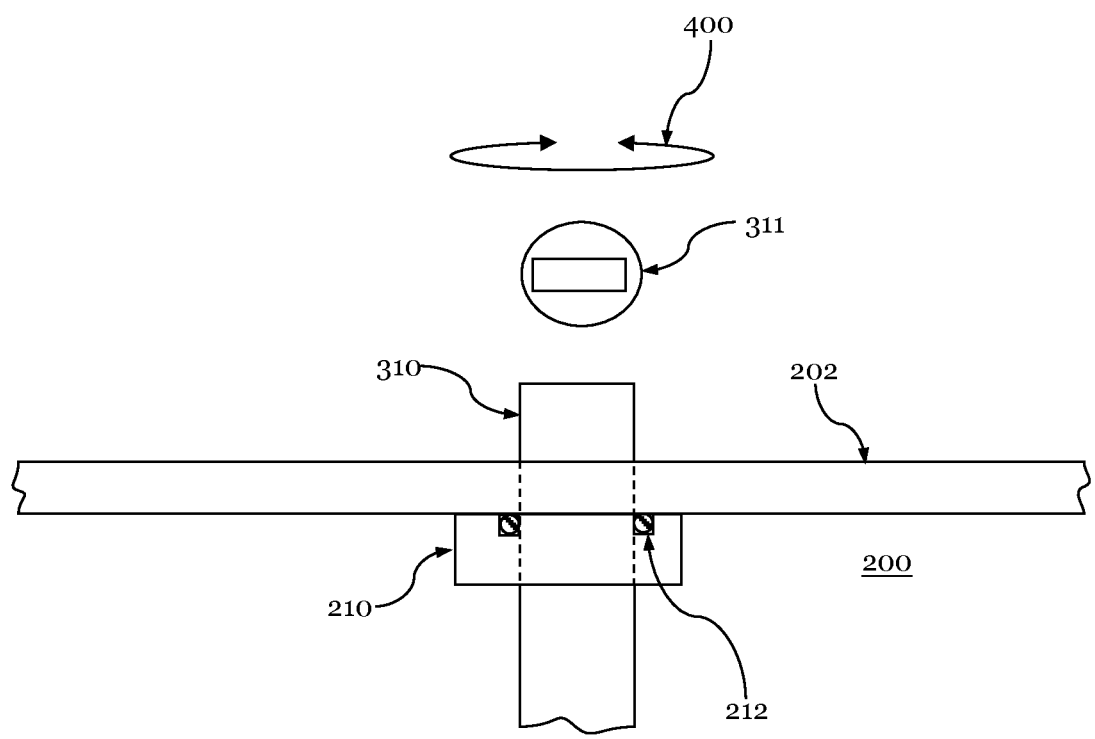
FIG. 9 illustrates details of the transmission through a wall of the vacuum chamber in one embodiment of the present invention.

In FIG. 9, because the transmission 310 will couple to the controller 300 and directly drive to the mount 330/340, it will exist in atmosphere and vacuum environments. Thus, the transmission 310 should be through wall 202 of the vacuum chamber 200. In order to maintain best vacuum quality of the chamber 200, a seal 210 encompasses the transmission 310 and an O-ring 212 is used inside the seal 210 to further seal the vacuum. Top surface 311 of the transmission 310 may have a structure 311 for rotation motion 400.

In the present invention, a method for calibrating a charge-regulation module under vacuum environment is provided, which comprises steps of providing a beam on a surface of a sample by the charge-regulation module to form a beam spot on the surface, detecting a location of the beam spot, calculating a pre-determined position of a charged particle beam on the surface, and driving the charge-regulation module such that the beam spot moves to the pre-determined position.

In the present invention, a method for calibrating the charge-regulation module in vacuum environment is also provided, which comprises steps of registering a location of the charge particle beam irradiated to the sample surface, receiving a reflected optical beam from the sample surface and illuminated by a Laser, calculating a position of the optical beam, and adjusting the Laser to illuminate the optical beam to the location of the charged particle beam on the sample surface. The procedures could be finished within several minutes in a vacuum environment, without days of the processing vacuum chamber.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A system for calibrating a charge-regulating module, comprising:
    means for mounting a Laser and providing motions to move the Laser, wherein the Laser illuminates a beam on a surface of a sample with a beam spot thereon, and regulates charges on the sample surface;
    a detector for receiving a reflected beam from the beam spot on the sample surface;
    a controller, coupled to the detector, for receiving signals from the detector, calculating a position of the beam spot, and controlling the beam spot to a pre-determined location; and
    a transmission, coupled to the controller, and driving the mounting means such that the beam spot is moved to the pre-determined location.

2. The system of claim 1, wherein the mounting means is fastened to an objective lens of a charged particle beam tool, and the pre-determined location is irradiated by a charged particle beam of the charged particle beam tool.

3. The system of claim 2, wherein the charged particle beam tool is an ebeam inspection tool.

4. The system of claim 3, wherein the sample is a wafer or a mask.

5. The system of claim 4, wherein the mounting means includes a first motor for driving the Laser with a rotational motion, and a second motor for driving the Laser with a vertical motion.

6. The system of claim 5, wherein the transmission is a hollow rod within wires for providing powers and instructions to the first and second motors.

7. The system of claim 4, wherein the mounting means is a C-shape mount and the Laser is fastened thereto.

8. The system of claim 7, wherein the transmission includes a rotation-to-translation means.

9. The system of claim 8, wherein the transmission includes a carved body fastened to the rotation-to-translation means and engaged to the C-shape mount.

10. The system of claim 9, wherein a portion of the C-shape mount is engaged with the carved body.

11. The system of claim 10, wherein the portion of the C-shape mount is forced to distort in vertical motion and the portion of the C-shape mount is forced to expand with horizontal motion.

12. An ebeam inspection tool, comprising:
    an electron tip for providing an electron source;
    an anode for extracting the electron source as a primary electron beam;
    a condenser lens for condensing the primary electron beam;
    a magnetic objective lens for focusing the primary electron beam on a surface of a sample;
    a charge-regulation module, fastened to the magnetic objective lens, for regulating charges on the sample surface; and
    a system for calibrating the charge-regulation module, includes:
        means for mounting the charge-regulation module and providing motions to move the charge-regulation module, wherein the charge-regulation module illuminates a beam on a surface of a sample with a beam spot thereon;
        a detector for receiving a reflected beam from the beam spot on the sample surface;
        a controller, coupled to the detector, for receiving signals from the detector, calculating a position of the beam spot, and controlling the beam spot to a pre-determined location; and
        a transmission, coupled to the controller, and driving the mounting means such that the beam spot is moved to the pre-determined location.

13. The ebeam inspection tool of claim 12, wherein the sample is a wafer or a mask.

14. The ebeam inspection tool of claim 13, wherein the mounting means includes a first motor for driving the charge-regulation module with a rotational motion, and a second motor for driving the charge-regulation module with a vertical motion.

15. The ebeam inspection tool of claim 14, wherein the transmission is a hollow rod within wires for providing powers and instructions to the first and second motors.

16. The ebeam inspection tool of claim 13, wherein the mounting means is a C-shape mount and the charge-regulation module is fastened thereto.

17. The ebeam inspection tool of claim 16, wherein the transmission includes a rotation-to-translation means.

18. The ebeam inspection tool of claim 17, wherein the transmission includes a carved body fastened to the rotation-to-translation means and engaged to the C-shape mount.

19. The ebeam inspection tool of claim 18, wherein a portion of the C-shape mount is engaged with the carved body.

20. The ebeam inspection tool of claim 19, wherein the portion of the C-shape mount is forced to distort in vertical motion and the portion of the C-shape mount is forced to expand with horizontal motion.

21. A method for calibrating a charge-regulation module under vacuum environment, comprising:
providing a beam on a surface of a sample by the charge-regulation module to form a beam spot on the surface, wherein the beam spot regulates charges on the sample surface;
detecting a location of the beam spot according to a reflection of the beam from the sample surface;
calculating a pre-determined position of a charged particle beam on the surface; and
driving the charge-regulation module such that the beam spot moves to the pre-determined position.

* * * * *